(12) United States Patent
Mooney et al.

(10) Patent No.: US 7,031,221 B2
(45) Date of Patent: Apr. 18, 2006

(54) FIXED PHASE CLOCK AND STROBE SIGNALS IN DAISY CHAINED CHIPS

(75) Inventors: Stephen R. Mooney, Beaverton, OR (US); Joseph T. Kennedy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 142 days.

(21) Appl. No.: 10/749,677

(22) Filed: Dec. 30, 2003

(65) Prior Publication Data

US 2005/0146980 A1    Jul. 7, 2005

(51) Int. Cl.
*G11C 7/00* (2006.01)
*G11C 8/00* (2006.01)

(52) U.S. Cl. ............ 365/230.05; 365/233; 365/194

(58) Field of Classification Search .......... 365/230.03, 365/230.05, 194, 233
See application file for complete search history.

(56) References Cited

U.S. PATENT DOCUMENTS

| | | | |
|---|---|---|---|
| 5,305,278 A * | 4/1994 | Inoue ................. | 365/230.03 |
| 5,546,023 A | 8/1996 | Borkar et al. | |
| 5,604,450 A | 2/1997 | Borkar et al. | |
| 5,661,692 A * | 8/1997 | Pinkham et al. ....... | 365/230.05 |
| 6,373,289 B1 | 4/2002 | Martin et al. | |
| 6,437,601 B1 | 8/2002 | Borkar et al. | |
| 6,493,250 B1 | 12/2002 | Halbert et al. | |
| 6,536,025 B1 | 3/2003 | Kennedy et al. | |
| 6,570,944 B1 | 5/2003 | Best et al. | |
| 6,658,509 B1 | 12/2003 | Bonella et al. | |
| 6,697,888 B1 | 2/2004 | Halbert et al. | |
| 6,742,098 B1 | 5/2004 | Halbert et al. | |
| 6,747,474 B1 | 6/2004 | Borkar et al. | |
| 6,832,325 B1 | 12/2004 | Liu | |
| 6,847,617 B1 | 1/2005 | Borkar et al. | |
| 6,871,253 B1 | 3/2005 | Greeff et al. | |
| 2002/0112119 A1 | 8/2002 | Halbert et al. | |

OTHER PUBLICATIONS

International Search Report for PCT/US2004/043426 (P17780PCT).
Written Oping for PCT/US2004/043426 (P17780PCT).

* cited by examiner

*Primary Examiner*—Trong Phan
(74) *Attorney, Agent, or Firm*—Alan K. Aldous

(57) ABSTRACT

In some embodiments, a chip includes first and second ports to provide first and second received data signals and first and second received strobe signal, respectively. An internal clock signal has a fixed phase relationship to the first received strobe signal and the second received strobe signal has an arbitrary phase relationship with the internal clock signal. First and second write blocks latch the first and second received data signals synchronously with the first and second received strobe signals, respectively. Other embodiments are described and claimed.

21 Claims, 9 Drawing Sheets

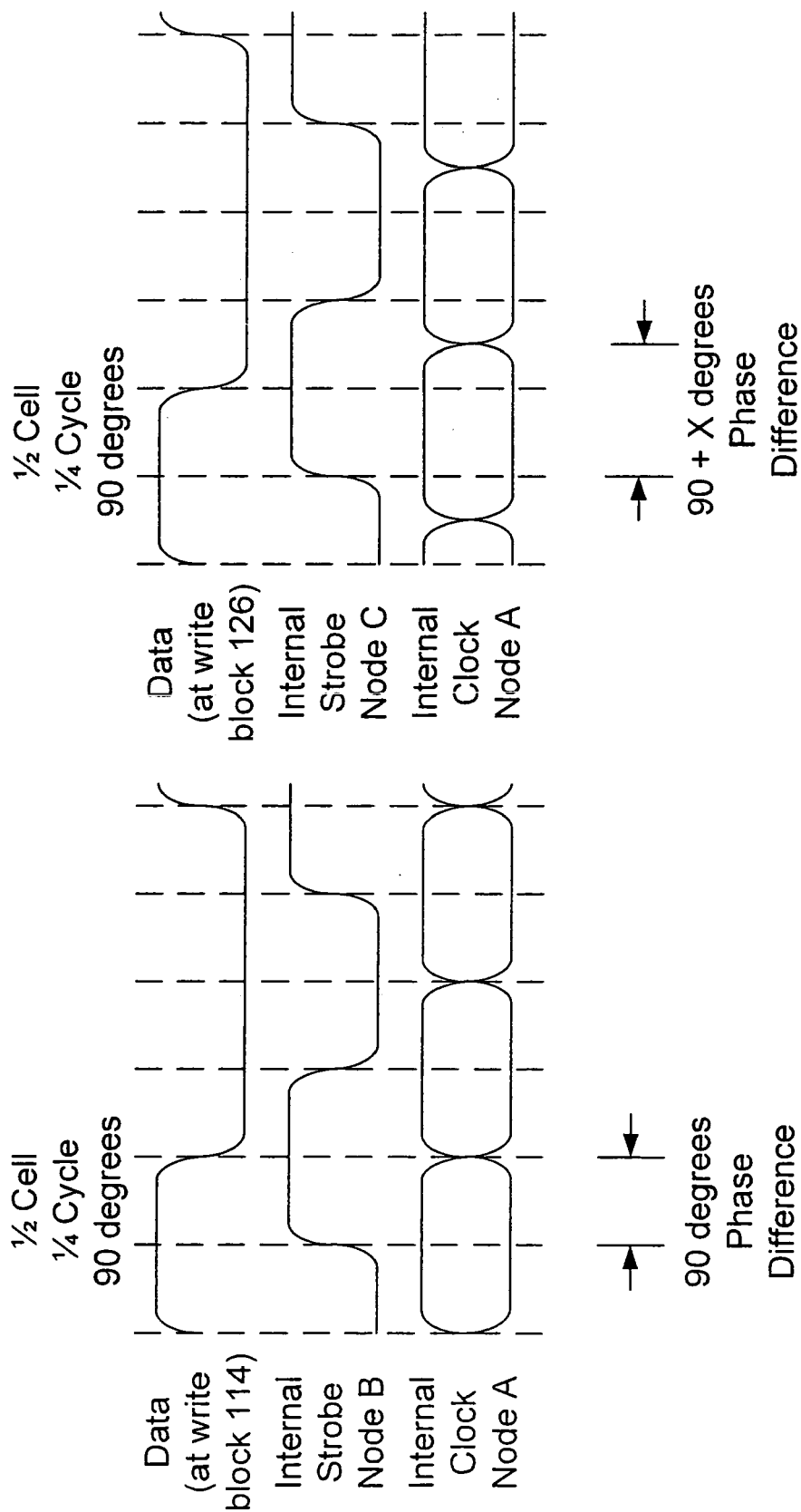

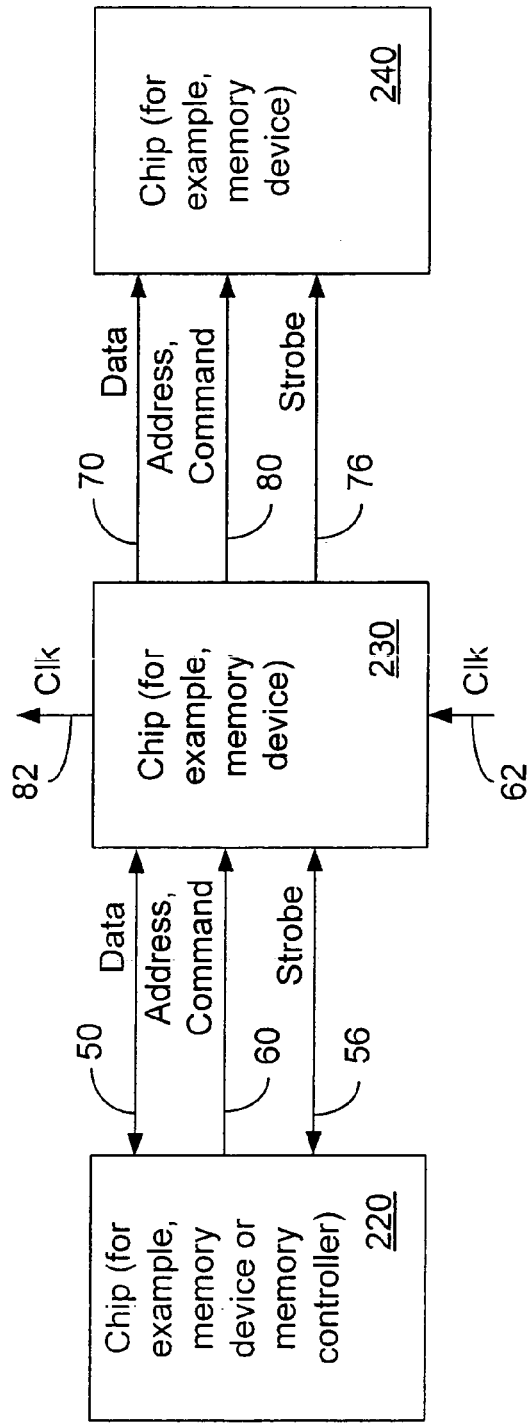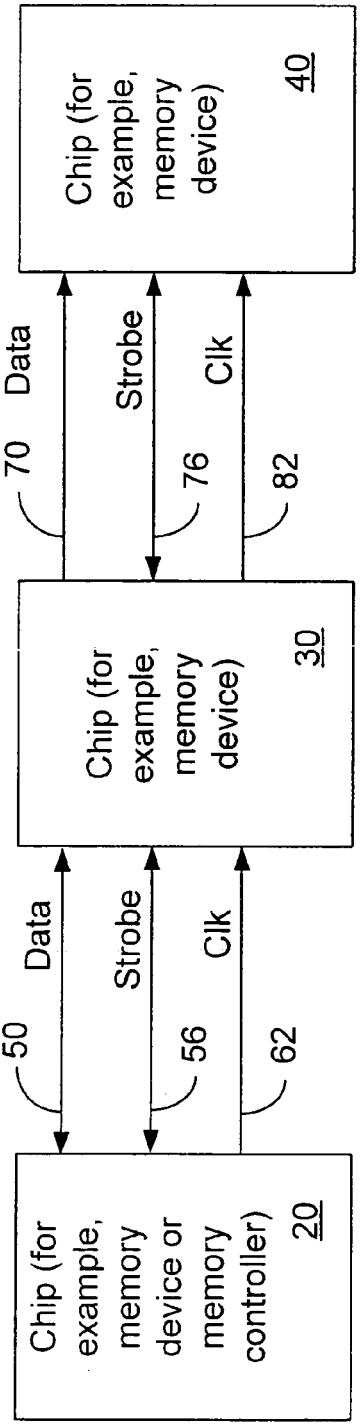
FIG. 6
FIG. 7

US 7,031,221 B2

FIXED PHASE CLOCK AND STROBE SIGNALS IN DAISY CHAINED CHIPS

BACKGROUND

TECHNICAL FIELD

The present inventions relate to integrated circuit chips and, more particularly, to daisy chained chips including a strobe signal and clock signal with a fixed phase relationship.

BACKGROUND ART

A multi-drop bus is used to connect more than two chips to a set of conductors. Dynamic Random Access Memory (DRAM) devices have commonly been used with a multi-drop bus. The multi-drop busses can have electrical discontinuities that generate distortion and limit the bandwidth over the bus channel. For synchronous systems, a clock is distributed to each chip. The clock is usually distributed in a similar multi-drop fashion, limiting the bandwidth of the clock channel. One way to increase bandwidth of the clock channel is to drive multiple copies of the clock to a memory module (such as a dual in line memory module (DIMM)) to limit loading. Another approach is to put a phase locked loop (PLL) component on the DIMM and use this to drive a clock to the DRAM devices. However, these approaches may add cost and power consumption to the system.

As an alternative to multi-drop systems, point-to-point interconnects have been used to reduce loading and avoid electrical discontinuities. Further, daisy chained chips have been proposed.

BRIEF DESCRIPTION OF THE DRAWINGS

The inventions will be understood more fully from the detailed description given below and from the accompanying drawings of embodiments of the inventions which, however, should not be taken to limit the inventions to the specific embodiments described, but are for explanation and understanding only.

FIGS. 3 and 4 are examples of timing diagrams.

FIGS. 6 and 7 are block diagram representations of systems according to some embodiments of the inventions.

DETAILED DESCRIPTION

A. Overview

Figure 1:
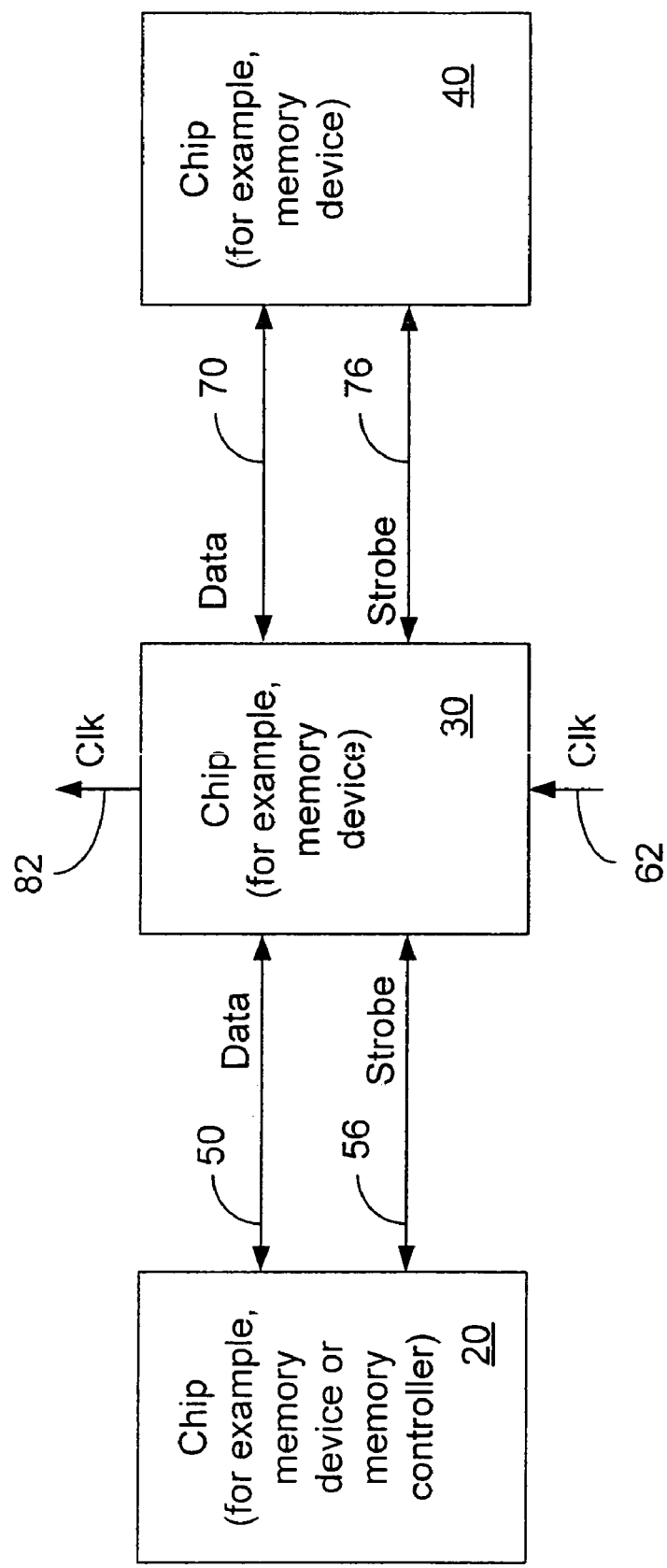
FIG. 1 is a schematic block diagram representation of a system according to some embodiments of the inventions.

Referring to FIG. 1, a daisy chained, point to point system includes chips 20, 30, and 40. As an example, chip 20 may include a memory controller or be a memory device and chips 30 and 40 may be memory devices, although the chips may be other than memory controllers or memory devices.

Chips 20 and 30 communicate with each other through at least data signals on conductors 50 and a first external strobe signal on conductor 56. Likewise, chips 30 and 40 communicate with each other through at least data signals on conductors 70 and a second external strobe signal on conductor 76. An external clock signal (clk) is passed from conductor(s) 62 to chip 30 to conductor(s) 82. The external clock signal may be the same clock signal as is used by chips 20 and/or 40 or a different clock signal. The data signal may be a traditional data signal with address and command signals being supplied separately, or the data signal may be a more generic signal that includes traditional data as well as address and/or command information time multiplexed or packetized with the traditional data signal.

A first received strobe signal is created in response to the first external strobe signal from chip 20 to chip 30 on conductor 56. A second received strobe signal is created in response to the second external strobe signal from chip 40 to chip 30 on conductor 76. The first received strobe signal is used to latch data from chip 20 to chip 30, and the second received strobe signal is used to latch data from chip 40 to chip 30. An internal clock signal for use by chip 30 is generated from the external clock signal on conductor(s) 62.

The phase relationships between the first external strobe signal on conductor 56, the second external strobe signal on conductor 76, and the external clock signal on conductor(s) 62 are arbitrary. Accordingly, the internal clock signal can have a fixed phase relationship with either the first received strobe signal or the second received strobe signal, but not with both the first and second received strobe signals. The received strobe signal with the fixed phase relationship is referred to herein as the fixed phase received strobe signal. One way to accomplish the fixed phase relationship is to alter the phase of the internal clock signal. The received strobe signal that does not have the fixed phase relationship is referred to herein as the arbitrary phase received strobe signal.

In this disclosure, the term low latency data paths refers to those data paths in which data is latched by the fixed phase received strobe signal or the internal clock, but not by the arbitrary phase strobe signal. It is called a low latency data path because the internal clock phase is fixed to the fixed received strobe signal in such a way as to provide low latency to these paths. The term arbitrary latency data paths refers to those data paths in which data is latched by the arbitrary phase strobe signal. The arbitrary latency data paths may have greater latency than the low latency data paths because the data may wait in a latch longer than is needed while waiting for the internal clock to be received. In some embodiments, the latency of the arbitrary latency data paths is greater than or equal to, but not less than, the latency of the low latency paths. In other embodiments, the latency of the arbitrary latency data paths may be slightly lower than that of the low latency data paths, but also can be equal to or greater.

Chip 30 acts as a repeater between chips 20 and 40 although it may do more than merely repeat data (for example, store data). That is, chip 30 repeats (retransmits) at least some data that it receives from chip 20 to chip 40 and repeats at least some data that it receives from chip 40 to chip 20. Depending on the embodiment, chips 20 and 40 might or might not also be repeaters.

B. Examples of Clocking for Low Latency Data Paths

Figure 2:
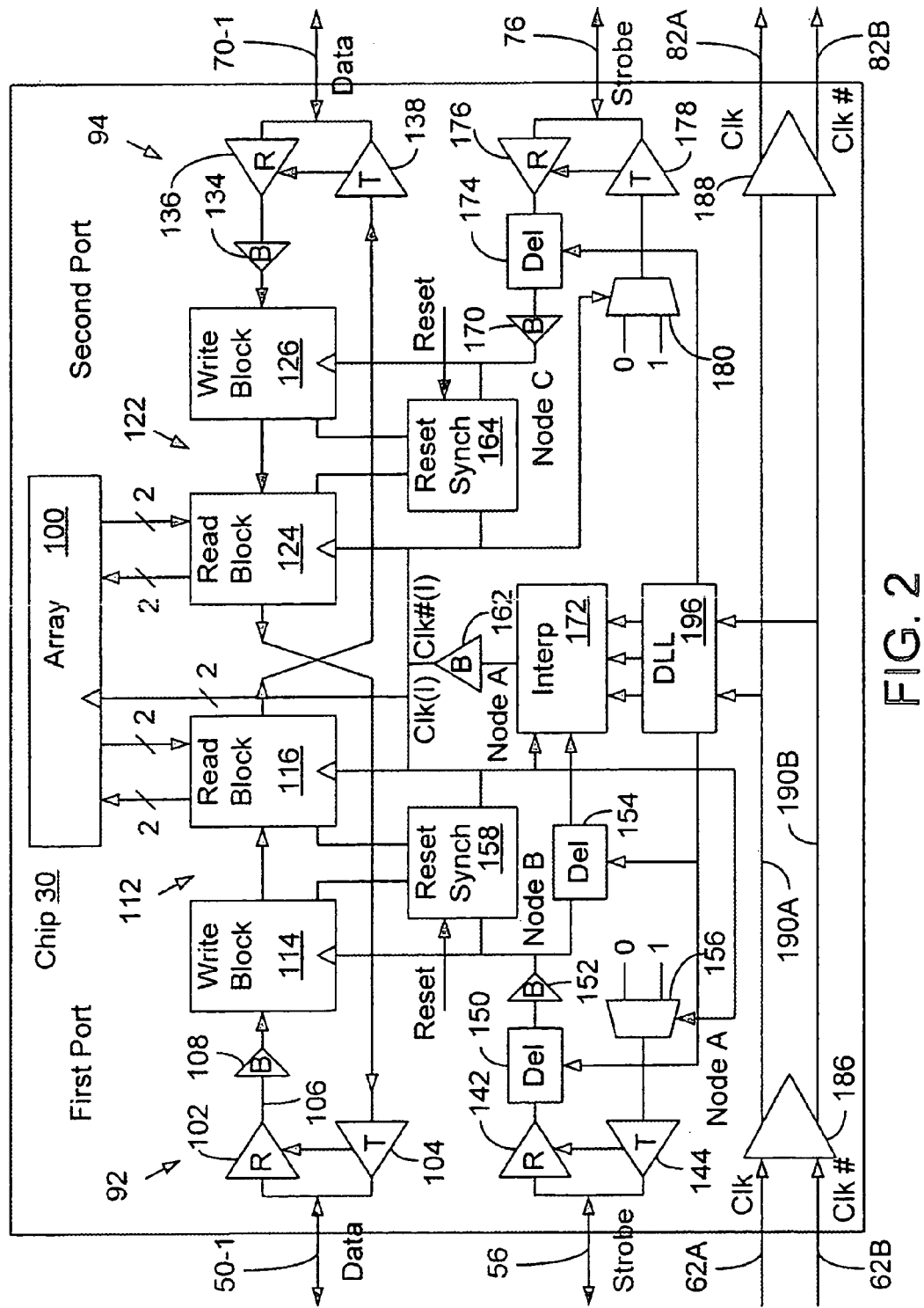
FIG. 2 is a schematic block diagram representation of some details of a chip of FIG. 1 according to some embodiments of the inventions.

FIG. 2 provides details of chip 30 according to some embodiments of the inventions, although various other details may be used. Receivers 102 and 142 and transmitters 104 and 144 form a first port 92 and receivers 136 and 176 and transmitters 138 and 178 form a second port 94. Note that it is arbitrary which port to label the first port and which to label the second port. Transmitters 104 and 138 and receivers 102 and 136 represent multiple data transmitters and receivers on each port (although there might be only one transmitter and receiver per port). Conductor 50-1 is one of conductors 50 and conductor 70-1 is one of conductors 70 of FIG. 1 (although there might be only one data conductor per port). FIG. 2 also illustrates conductors 56 and 76 of FIG. 1. In the embodiment of FIG. 2, the external clock signal (clk) of FIG. 1 is a differential clock (Clk and Clk#), but it could be single ended. Conductors 62A and 62B and conductor 82A and 82B, which carry the differential external clock signals Clk and Clk#, are examples of conductor(s) 62 and 82, respectively, of FIG. 1. A high bandwidth, low jitter clock can help reduce jitter that could otherwise accumulate at each interface. To reduce jitter, in addition to providing the clock differentially, a low voltage swing may also be used. Further, as an example, receiver 186 and transmitter 188 may include current-mode, differential amplifiers. The data and external strobe signals may be full voltage swing or low voltage swing signals.

The external differential clock signal (Clk, Clk#) is received by receiver 186 which drives the external differential clock signal on conductors 190A and 190B to a delay locked loop (DLL) circuit 196 and transmitter 188. Transmitter 188 drives the external differential clock signal to conductors 82A and 82B to be received by another chip or perhaps to be terminated. Buffering provided by receiver 186 may be designed to provide high supply and common mode rejection and very small jitter. DLL circuit 196 locks to the buffered external differential clock signal and is selected to lock to a particular phase of the external differential clock signal (for example, 180° (degrees)) and to generate, for example, four equally spaced delays across a complete clock cycle at DLL taps. The spaced delays may be fed through the taps to an interpolator 172 to produce, for example, an adjustable delay of 32 steps over 360°. Interpolator 172 provides a phase adjusted internal differential clock signal (Clk(I), Clk#(I)) through buffer 162 to a node A (although it could be signal ended). The phase adjusted internal differential clock signal at node A is provided to read blocks 116 and 124 and reset synchronizers 158 and 164.

In some embodiments, the phase adjusted internal differential clock signal provides double data rate clocking for data signals passing between array 100 and read blocks 116 and 124, although it could be something else, for example, single data rate or quad-data rate. In some embodiments, there are two conductors in each direction between array 100 and read block 116 for each one of conductors 50 and 70. The reason why there are two conductor in each direction is that array 100 may operate at, for example, ½ the frequency of the port interfaces, so twice the number of conductors are used to get the same data. In FIG. 2, the conductors between array 100 and read blocks 116 and 124 are shown as being unidirectional, but they could be bi-directional. Further, there might be only one conductor in each direction or one bi-directional conductor (for each conductor of conductors 50 and 70) rather than two between array 100 and each read blocks. Array 100 is not required in all embodiments.

In some embodiments, the data signals on conductors 50 and 70 and the external strobe signals on conductors 56 and 76 are transmitted as a simultaneous bidirectional (SBD) signals. As an alternative, the data and strobe signals may be unidirectional signals or sequential bi-directional signals. The data and strobe conductors may be single ended or differential.

In response to detecting the data signals on conductors 50-1 and 70-1, receivers 102 and 136 provide first and second received data signals to buffers 108 and 134, which in turn provide the received data signals to write blocks 114 and 126, respectively. In some embodiments, write block 114 and read block 116 form a first-in first-out (FIFO) circuit 112 in which data is written into the FIFO synchronously with the strobe signal at node B and is read out of the FIFO synchronously with the clock signal at node A. Likewise, in some embodiments, write block 126 and read block 124 form a FIFO circuit 122 in which data is written into the FIFO synchronously with the strobe signal at node C and is read out of the FIFO synchronously with the clock signal at node A. Reset synchronizers 158 and 164 start a pointer for writing and a pointer for reading at desired places at reset, and may also can keep the latency between writing and reading from being too great or too small (discussed below).

In some embodiments, the external strobe signals on conductors 56 and 76 are in phase with the received data signals on conductors 50-1 and 70-1, respectively. In this case, the received strobe signals may be delayed by delay circuits 150 and 174 by, for example, 90° and output by buffers 152 and 170 to provide the first and second received strobe signals at nodes B and C, respectively. In the case of FIG. 2, the first and second received strobe signals are also delayed received strobe signals. The first and second received strobe signals then have a desired phase relationship with respect to received data signals received by the write blocks 114 and 126 from buffers 108 and 134. The received strobe signals at nodes B and C are used by write blocks 114 and 126 to latch the received data signals. (Alternatively, the data signals could already have the desired phase relationship with the external strobe signals so that a substantial delay would not be needed.) The received strobe signals may be differential or single ended. Buffers 108 and 152, 134 and 170, and 162 provide desired delays and signal drive. Buffers 108, 152, 134, 170, and 162 may be carefully matched as desired.

The first received strobe signal is further delayed by delay circuit 154 under the control of DLL 196 to create a desired phase delay difference between nodes B and A, and hence between writing into and reading from FIFO 112. An example of the desired minimum delay is 90°. In the example of FIG. 2, delay circuits 150, 154, and 174 are low power consuming slave delay circuits controlled by DLL circuit 196 which acts as a master. Interpolator 172 receives the further delayed first received strobe signal from delay circuit 154 and at least part of the phase adjusted internal clock signal from node A and adjusts the phase adjusted internal clock signal to be in phase with the further delayed received strobe signal from delay circuit 154. Accordingly, in the example of FIG. 2, the first received strobe signal is the fixed phase received strobe signal and the second received strobe signal is the arbitrary phase received strobe signal. However, the circuitry of FIG. 2 could be modified so that just the opposite were the case. In the example, the delay is 90° which leads to a low latency for those data paths involving FIFO 112. The latency in data paths involving both write block 126 and read block 124 is an arbitrary latency because data written into FIFO 122 can take an arbitrary amount of time (within the limits discussed) to be read out.

In the example of FIG. 2, the following data paths are low latency data paths:
  the path from conductor 50-1 through receiver 102, buffer 108, write block 114, read block 116, and transmitter 138 to conductor 138;
  the path from conductor 50-1 through receiver 102, buffer 108, write block 114, read block 116 to array 100;

the path from array 100 to read block 116 to transmitter 138 to conductor 70-1; and the path from array 100 to read block 124 to transmitter 104 to conductor 50-1.

In the example of FIG. 2, the following are arbitrary latency data paths:

the path from conductor 70-1 through receiver 136, buffer 134, write block 126, and read block 124 to array 100; and the path from conductor 70-1 through receiver 136, buffer 134, write block 126, read block 124, and transmitter 104 to conductor 50-1.

As an example, FIG. 3 shows the first received strobe signal at node B being 90° out of phase with the received data signal at write block 114. FIG. 4 shows the second received strobe signal at node C being 90° out of phase with the received data signal at write block 126. In FIG. 3, the phase adjusted internal clock signal at node A is 90° out of phase with the received strobe signal at node B. In FIG. 4, the phase adjusted internal clock signal at node A is an arbitrary amount out of phase with the received strobe signal at node C. The arbitrary phase difference in FIG. 4 is expressed as a desired minimum phase difference (for example 90°)+X°, where in X may be for example, 360°. In other embodiments, X might be some other amount such as 270° or 450°. In some embodiments, synchronizers 158 and 164 add phase difference between writing and reading if the phase difference between nodes A and B or A and C gets below the desired minimum amount (in this example 90°) and will remove phase difference if the phase difference gets more than the minimum amount+X (in this example 90°+360°). Because of the fixed delay between nodes A and B, it may be that synchronizer 158 does not have add or remove phase difference. Although the desired minimum phase difference is mentioned as 90°, other amounts might be used such as 270° (that is, in 1.5 bit cells). As illustrated in FIGS. 3 and 4, 90° corresponds to ½ a bit cell and ¼ cycle. Note that the desired minimum phase difference and the additional delay X do not have to be multiples of 90°.

In some embodiments, chip 30 transmits all the data signals that it receives from chip 20 to chip 40. Chip 30 also decides whether the data signals is to be used by chip 30 (for example, stored by chip 30) or are merely to be passed on to chip 40. Examples of techniques for deciding whether chip 30 is to use the data include (1) having a particular portion of the data signal currently being received indicate how it is to be used, (2) having a portion of a data signal previously received indicate how a future data signal is to be used, or (3) using a separate chip select signal (not shown). In other embodiments, chip 30 will only pass on only some of the data signals it receives from chip 20 to chip 40. However, passing on only some of the data signals may add significant complexity and/or delay.

Strobe creation circuitry 156 and 180 creates strobes to be driven by transmitter 144. The strobe creation may be constant or gated to occur only around the time data signals are to be driven by transmitters 104 or 138.

Figure 5:
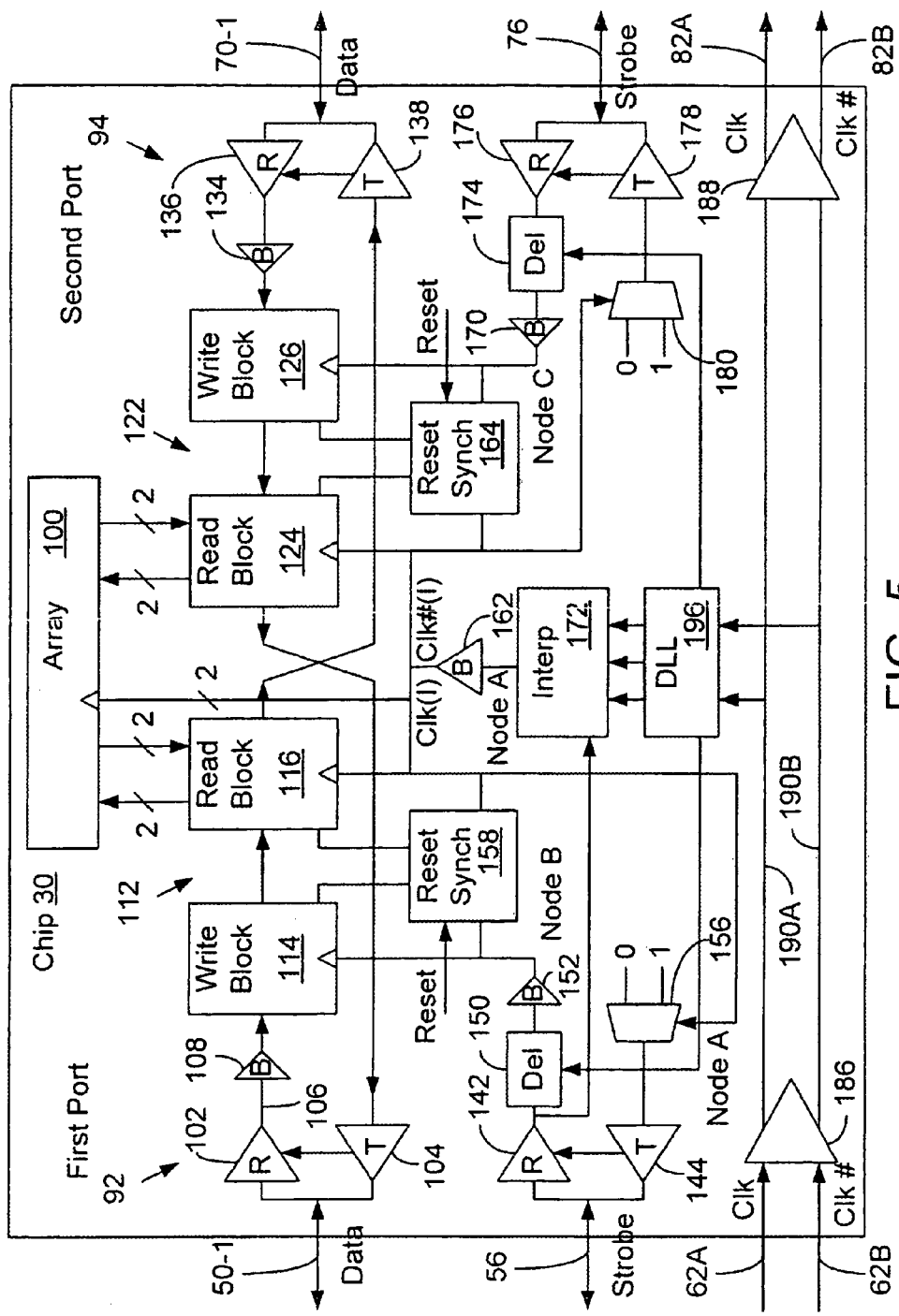
FIG. 5 is an alternative to the details of FIG. 2 according to some embodiments of the inventions.

FIG. 5 illustrates alternative circuitry to that of FIG. 2. FIG. 5 is like FIG. 2 except that the received strobe signal is provided from receiver 142 to interpolator 172 and there is no delay circuitry 154 between node B and interpolator. Various other alternatives could be used.

C. Additional System Level Examples

FIG. 6 illustrates a system that is similar to FIG. 1 except that it includes conductors 60 and 80 to carry address and command signals between chips 220, 230, and 240. The conductors are shown as being unidirectional, but could be bidirectional in some embodiments. FIG. 7 is similar to FIG. 1 except that the clock signal passes from chip 20 to chip 30 and from chip 30 to chip 40.

Figure 8:
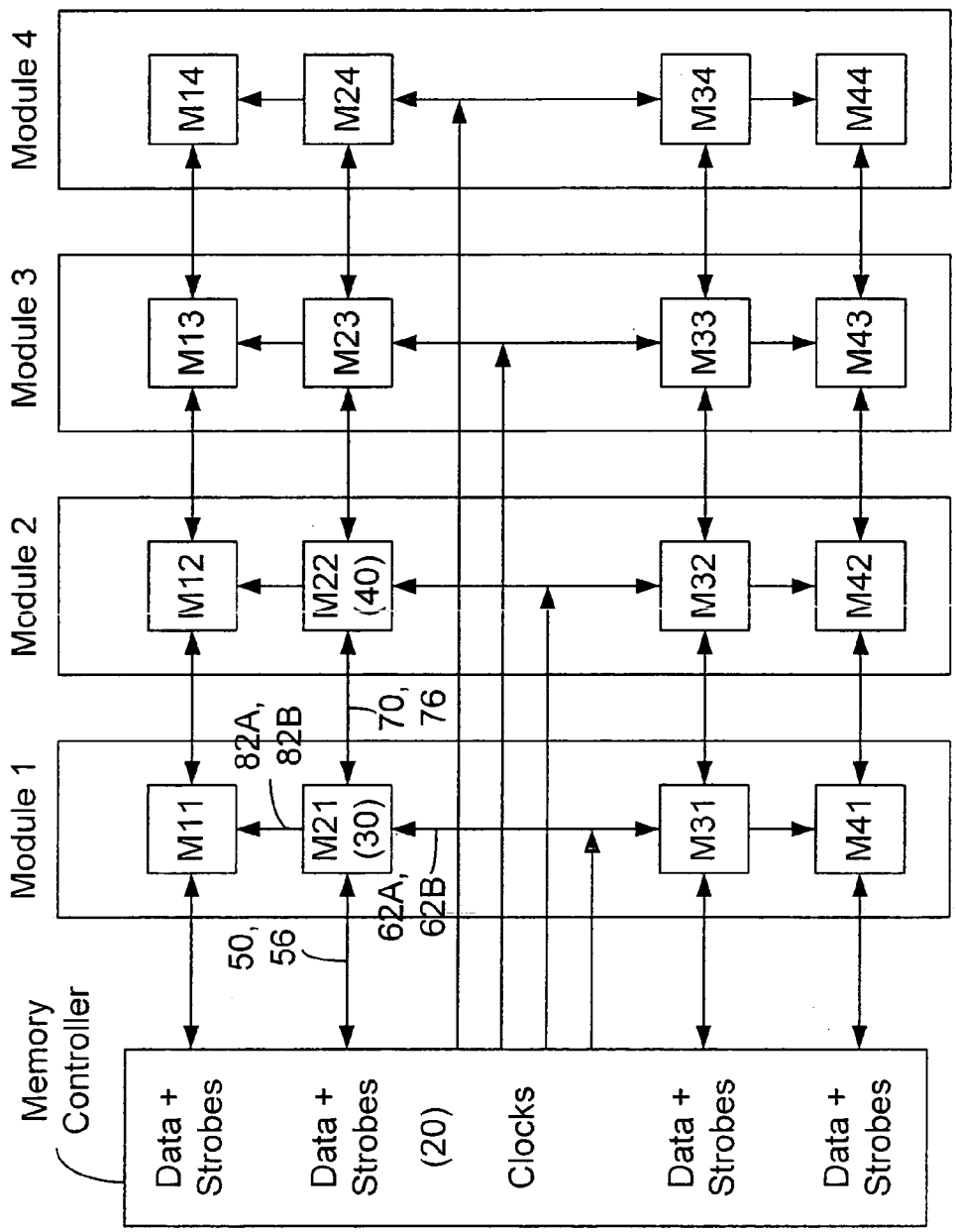
FIGS. 8 and 9 are block diagram representations of a system including memory modules according to some embodiments of the inventions.
Figure 9:
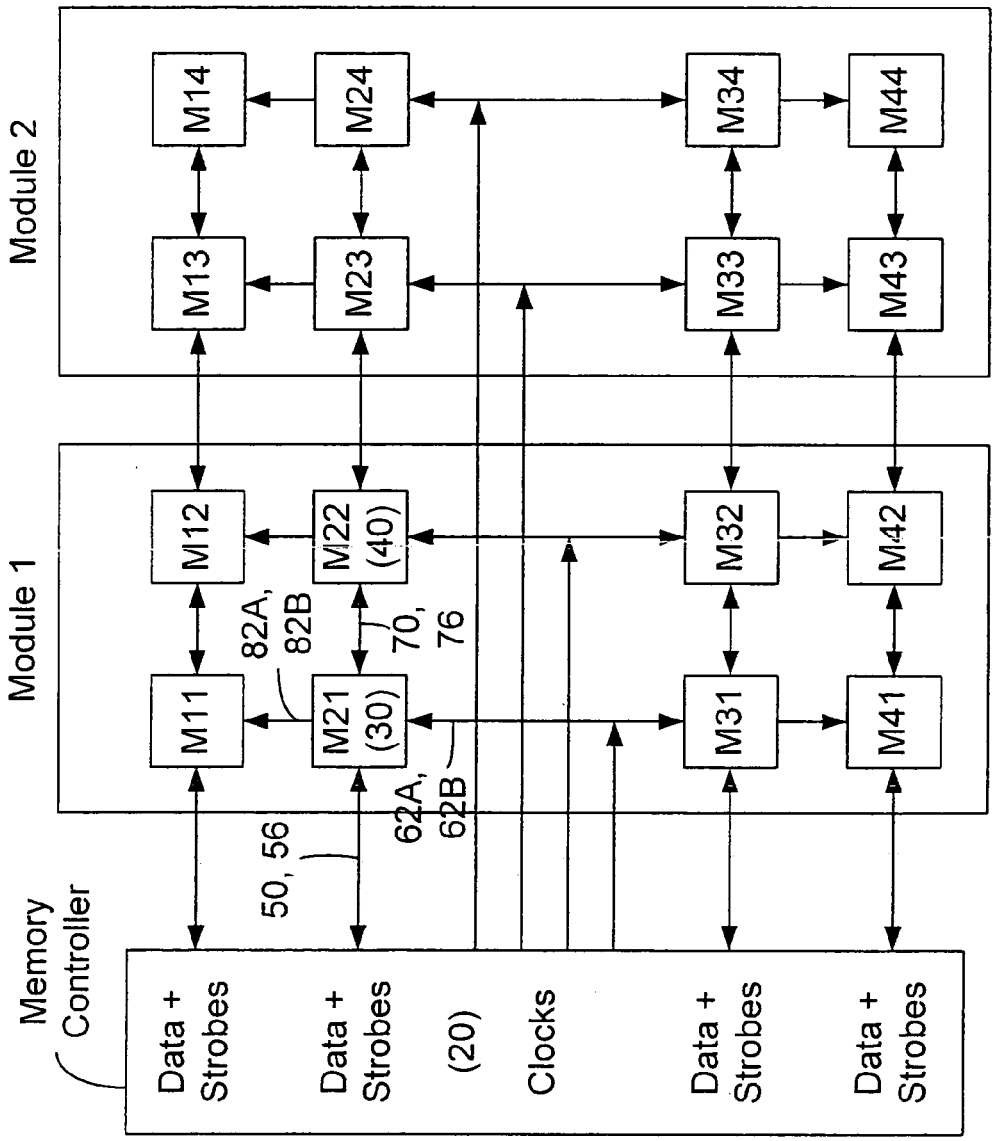

FIG. 8 illustrates chips 20, 30, and 40 of FIG. 1 in a larger daisy chained point to point system where chip 20 is a memory controller that provides data and strobe signals to memory chips M11, M21, M31, and M41 on module 1. Note that, in this example, chip 30 is chip M21 and chip 40 is chip M22. Chips M11, M21, M31, and M41 repeat the data signals to memory chips M12, M22, M32, and M42 on module 2, which in turn repeat data signals to memory chips M13, M23, M33, and M43 on module 3, which in turn repeat the data signals to memory chips M14, M24, M34, and M44 on module 4. The chips regenerate strobe signals to send to these chips as discussed. Clock signals are provided by memory controller 20 and are each passed on to one of the memory modules where they are distributed to memory chips. The clock signals could originate other than in the memory controller. The modules may be dual in line memory modules (DIMMs) or other types of modules. FIG. 9 is similar to FIG. 8 except that there are two modules rather than four. FIG. 8 illustrates four chips per module out of convenience for illustration, but there could be more than four memory chips per module and a single clock signal could be distributed to all the chips. In the case of FIG. 9, there could be more than eight memory chips per module. In actual systems, there could be more, less, or the same number of modules as is shown in FIGS. 8 and 9. Rings or other topologies than those shown in FIGS. 8 and 9 may be used. For example, memory chips M14, M24, M34, and M44 may be coupled through conductors directly to memory controller 20.

Jitter accumulation is a potential problem with the clock daisy-chained through multiple chips. The clock may set the baseline jitter for a chip and retime the data such that the maximum jitter in the chain be held to tolerable levels.

D. Additional Details

The following is a discussion of exemplary techniques for SBD signaling. Referring to FIG. 2, an SBD signal can be created by transmitter 104 driving a particular signal and receiver 102 monitoring the voltage on conductor 50-1. Receiver 102 may subtract the voltage of the outgoing data from the voltage on conductor 50-1 to receive the incoming data signal. The amplifier may perform outbound subtraction by use of a pair of selectable reference voltages. The state of the output data signal is used to select the appropriate reference voltages, effecting a digital subtraction of the outbound data signal from the data signal present on conductor 50-1. The timing of the reference voltage change should be such as to match the output data from transmitter 102. Table 1 below shows an example for SBD signaling, where Vcc is the supply voltage for transmitters and receivers of chips 20, 30, and 40 and where a logical high voltage is near Vcc and a logical low voltage is near Vss (ground). This could be at full voltage swing or at a low voltage swing.

TABLE 1

(example of SBD signaling)

| Voltage driven by transmitter 104 to conductor 50-1 | Reference voltage of receiver 102 | Voltage driven by transmitter in chip 20 to conductor 50-1 | Output of receiver 102 |
| --- | --- | --- | --- |
| Logical high | ¾ Vcc | Logical high | Logical high |
| Logical high | ¾ Vcc | Logical low | Logical low |

TABLE 1-continued (example of SBD signaling)

| Voltage driven by transmitter 104 to conductor 50-1 | Reference voltage of receiver 102 | Voltage driven by transmitter in chip 20 to conductor 50-1 | Output of receiver 102 |
|---|---|---|---|
| Logical low | ¼ Vcc | Logical high | Logical high |
| Logical low | ¼ Vcc | Logical low | Logical low |

Figure 10:
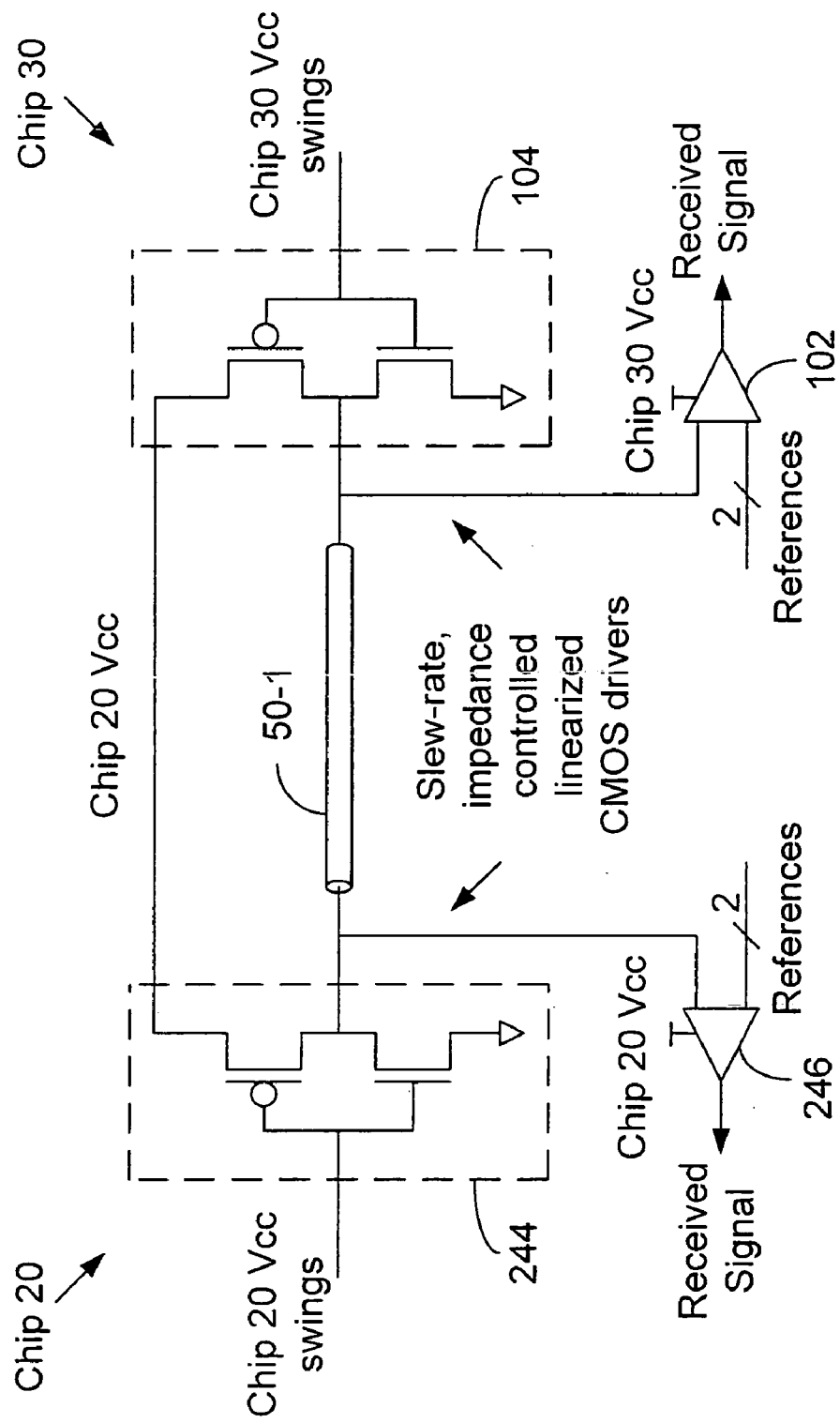
FIG. 10 is a schematic representation of details of transmitters and receivers according to some embodiments of the inventions.

Transmitters 104, 144, 138, and 178 are not restricted to any particular circuitry. In some embodiments, transmitters such as transmitter 104 may perform as both a termination and a level translator between chip 30 and chip 20 supply voltages. Referring to FIG. 10, to perform the translation function, the logic power supply (chip 20 Vcc) may be connected to a p-type metal oxide semiconductor field effect transistor (PMOSFET) section of a push-pull transmitter 244 in chip 20, and drive one-half this supply voltage level. As the transmitters may also serve as terminators, tunable, binary weighted, complementary MOS (CMOS) push-pull transmitters 104 and 244 with linearizing resistors (not shown) may be used. Transmitter 104 receives signals with swings within the Vcc of chip 30 (chip 30 Vcc swings) and transmitter 244 receives signals with swings within the Vcc of chip 20 (chip 20 Vcc swings). The transmitter may implement a slew-rate control function by further segmenting the buffer transistors into four equal subsegments driving in parallel. Delay-line taps may drive these segments to effect a controlled output switching rate, reducing high-frequency content of the channel. The Vccs of chips 20 and 30 may be the same or different. Receivers 246 and 102 are shown. Low voltage swing may be achieved by, for example, replacing the PMOSFET with an n-type MOSFET (NMOSFET). Note that the transistors do not have to be a metal oxide semiconductor type of FETs or even FETs.

Figure 11:
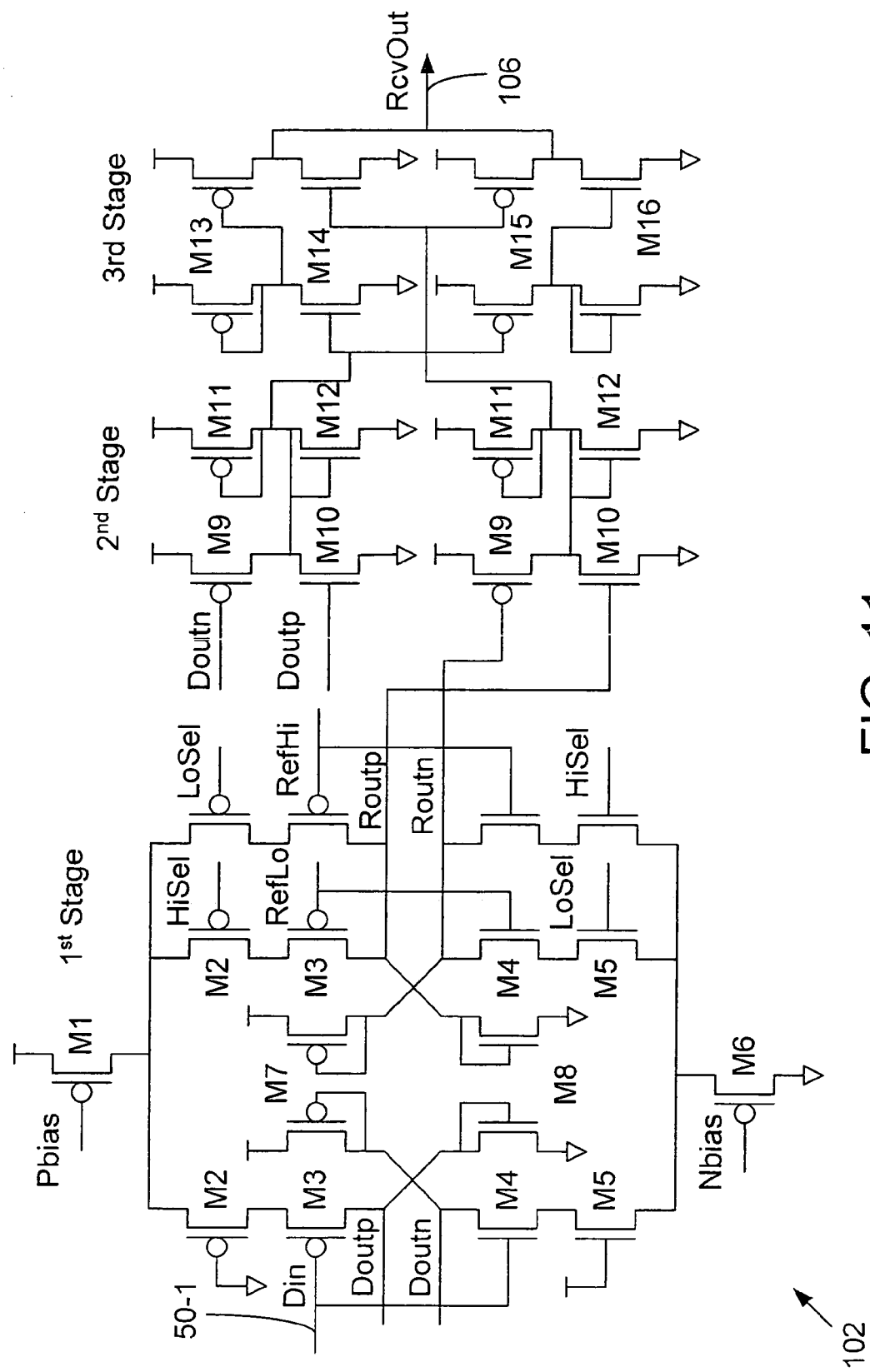
FIG. 11 is a schematic representation of details a receiver according to some embodiments of the inventions.

The inventions are not restricted to a particular type of receiver. In some embodiments, receivers 102, 142, 136, and 176 may include the details shown in FIG. 11, but this is not required. Referring to FIG. 11, receiver 102 may subtract the voltage of the outgoing data from transmitter 104 from the voltage on conductor 50-1 to receive the incoming data signal; be capable of operating over a wide range of input common mode levels; maintain high common-mode noise rejection; and provide amplification to convert the received signals to CMOS levels. As shown in the example of FIG. 11, receiver 102 may have three stages. The first stage may be based on a pair of complementary differential amplifiers and provide wide common-mode input range and common-mode noise rejection. The amplifier may perform outbound subtraction by use of a pair of selectable references RefHi and RefLo selected by signals HiSel and LoSel. The first stage (including the following transistors: M1, two M2's, two M3's, two M4's, two M5's, M6, two M7's, and two M8's) may be further divided into four parallel segments to achieve staged, controlled switching between the two references in order to maintain a closely matched relationship with slew-rate controlled outbound data switching. The first stage receives signals Pbias, Nbias, Din, LoSel, and RefHi, and provides signals Down, Doutp, Routn, and Toutp. The second stage amplifier (including the following transistors: two M9's, two M10's, two M11's, and two M12's) may provide gain, common mode restoration, and combine the outputs of the first stage differential amplifiers into a single differential signal. The second stage receives signals Doutn, Doutp, Routn, and Routp. The third stage (including the following transistors: two M13's, two M14's, two M15's, and two M16's) may provide additional gain and convert the differential signal into a single-ended CMOS output at conductor 106. The third stage provides signal RcvOut.

There may be various additional circuitry that are not illustrated (for example, electrostatic discharge circuitry). There may be additional strobe and/or clock signals provided to the chips.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

The inventions are not restricted to the particular details described herein. Indeed, many other variations of the foregoing description and drawings may be made within the scope of the present inventions. Accordingly, it is the following claims including any amendments thereto that define the scope of the inventions.

What is claimed is:

1. A chip comprising:
   a first port to provide a first received data signal and a first received strobe signal;
   a second port to provide a second received data signal and a second received strobe signal;
   circuitry to provide an internal clock signal with a fixed phase relationship to the first received strobe signal, wherein the second received strobe signal has an arbitrary phase relationship with the internal clock signal; and
   first and second write blocks to latch the first and second received data signals synchronously with the first and second received strobe signals, respectively.

2. The chip of claim 1, wherein the chip includes data paths, and the data paths that include the first write block are low latency data paths, and the data paths that include the second write block are arbitrary latency data paths.

3. The chip of claim 2, further comprising:
   a memory array;
   a first read block to be clocked by the internal clock, wherein the first read block interfaces between the first write block and the memory array, and interfaces between the memory array and a transmitter of the second port; and
   a second read block to be clocked by the internal clock, wherein the second read block interfaces between the second write block and the memory array, and interfaces between the memory array and a transmitter of the first port.

4. The chip of claim 3, wherein the internal clock signal clocks data in the first and second read clocks at a double data rate.

5. The chip of claim 3, wherein the data paths that include the first read block or that carry data from the memory array to the second port through the second read block are low latency data paths.

6. The chip of claim 1, wherein the internal clock signal is a phase adjusted internal clock signal and wherein the circuitry to provide the internal clock includes delayed locked loop circuitry that receives a non-phase adjusted internal clock and provides timing signals to an interpolator which produces the phase adjusted internal clock signal.

7. The chip of claim 6, wherein the interpolator receives at least a portion of the phase adjusted internal clock signal as an input and receives a delayed received strobe signal as an input.

8. The chip of claim 6, wherein the internal clock signal is a phase adjusted differential internal clock signal.

9. The chip of claim 1, where in chip repeats data it receives from the first port to a transmitter at the second port.

10. A system comprising:
a first chip and a second chip; and
a third chip comprising:
a first port coupled to first chip to provide a first received data signal and a first received strobe signal;
a second port coupled to second chip to provide a second received data signal and a second received strobe signal;
circuitry to provide an internal clock signal with a fixed phase relationship to the first received strobe signal, wherein the second received strobe signal has an arbitrary phase relationship with the internal clock signal; and
first and second write blocks to latch the first and second received data signals synchronously with the first and second received strobe signals, respectively.

11. The system of claim 10, wherein the third chip repeats data that it receives from the first port to the second chip and data that it receives from the second port to the first chip.

12. The system of claim 10, wherein the third chip includes data paths, and the data paths that include the first write block are low latency data paths, and the data paths that include the second write block are arbitrary latency data paths.

13. The system of claim 12, wherein the third chip further comprises:
a memory array;
a first read block to be clocked by the internal clock, wherein the first read block interfaces between the first write block and the memory array, and interfaces between the memory array and a transmitter of the second port; and
a second read block to be clocked by the internal clock, wherein the second read block interfaces between the second write block and the memory array, and interfaces between the memory array and a transmitter of the first port.

14. The system of claim 13, wherein the internal clock signal clocks data in the first and second read clocks at a double data rate.

15. The system of claim 13, wherein the data paths that include the first read block or that carry data from the memory array to the second port through the second read block are low latency data paths.

16. The system of claim 10, wherein the internal clock signal is a phase adjusted internal clock signal and wherein the circuitry to provide the internal clock includes delayed locked loop circuitry that receives a non-phase adjusted internal clock and provides timing signals to an interpolator which produces the phase adjusted internal clock signal.

17. The system of claim 16, wherein the interpolator receives at least a portion of the phase adjusted internal clock signal as an input and receives a delayed received strobe signal as an input.

18. The system of claim 10, wherein the signaling between the first and second chips and between the second and third chips is simultaneous bi-directional and the first received data signal and the first received strobe signal are provided responsive to a data signal and a strobe signal from the first chip, and the second received data signal and the second received strobe signal are provided responsive to a data signal and a strobe signal from the second chip.

19. A chip comprising:
a first port to provide a first received data signal and a first received strobe signal;
a second port to provide a second received data signal and a second received strobe signal;
circuitry to provide a phase adjusted internal clock signal with a fixed phase relationship to the first received strobe signal, wherein the second received strobe signal has an arbitrary phase relationship with the internal clock signal; and
delay circuitry to delay the first received data strobe signal to latch the first data and to delay the second received data strobe signal to latch the second received data signal.

20. The chip of claim 19, wherein the chip includes data paths, and the data paths that include the first write block are low latency data paths, and the data paths that include the second write block are arbitrary latency data paths.

21. The chip of claim 20, further comprising:
a memory array;
a first read block to be clocked by the internal clock, wherein the first read block interfaces between the first write block and the memory array, and interfaces between the memory array and a transmitter of the second port; and
a second read block to be clocked by the internal clock, wherein the second read block interfaces between the second write block and the memory array, and interfaces between the memory array and a transmitter of the first port.

* * * * *